United States Patent
Sim et al.

(10) Patent No.: US 11,581,135 B2
(45) Date of Patent: Feb. 14, 2023

(54) ELECTRONIC COMPONENT AND BOARD HAVING THE SAME MOUNTED THEREON

(71) Applicant: SAMSUNG ELECTRO-MECHANICS CO., LTD., Suwon-si (KR)

(72) Inventors: Min Kyeong Sim, Suwon-si (KR); Beom Joon Cho, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 67 days.

(21) Appl. No.: 17/186,390

(22) Filed: Feb. 26, 2021

(65) Prior Publication Data

US 2022/0076884 A1 Mar. 10, 2022

(30) Foreign Application Priority Data

Sep. 9, 2020 (KR) .................... 10-2020-0115242

(51) Int. Cl.
  *H01G 2/06* (2006.01)
  *H01G 4/30* (2006.01)
  *H05K 1/11* (2006.01)
  *H05K 1/18* (2006.01)
  *H01G 4/248* (2006.01)

(52) U.S. Cl.
  CPC ............ *H01G 2/065* (2013.01); *H01G 4/248* (2013.01); *H01G 4/30* (2013.01); *H05K 1/111* (2013.01); *H05K 1/181* (2013.01); *H05K 2201/10015* (2013.01)

(58) Field of Classification Search
  CPC ....................................................... H01G 2/064
  USPC ............................................................ 174/260
  See application file for complete search history.

(56) References Cited

U.S. PATENT DOCUMENTS

| | | | |
|---|---|---|---|
| 6,574,089 B1 * | 6/2003 | Moriwaki | H01G 4/232 361/306.3 |
| 2010/0078505 A1 * | 4/2010 | Kato | H01L 41/0475 239/546 |
| 2011/0037351 A1 * | 2/2011 | Kasai | H01L 41/0472 310/364 |
| 2016/0050759 A1 * | 2/2016 | Park | H01G 4/30 174/260 |
| 2017/0367186 A1 * | 12/2017 | Park | H01G 4/12 |
| 2018/0268996 A1 * | 9/2018 | Na | H01G 4/232 |

FOREIGN PATENT DOCUMENTS

| | | |
|---|---|---|
| JP | H11-74147 A | 3/1999 |
| JP | 2004-273935 A | 9/2004 |
| KR | 10-1191300 B1 | 10/2012 |
| WO | 2010/111575 A2 | 9/2010 |

* cited by examiner

*Primary Examiner* — Stanley Tso
(74) *Attorney, Agent, or Firm* — Morgan, Lewis & Bockius LLP

(57) ABSTRACT

An electronic component and a board having the same mounted thereon are provided. The electronic component includes a capacitor body, a pair of external electrodes, respectively disposed on end portions of the capacitor body, a pair of metal frames, respectively disposed to be connected the pair of external electrodes, and a conductive bonding layer disposed between the external electrode and the metal frame and having a discontinuous region.

20 Claims, 8 Drawing Sheets

ELECTRONIC COMPONENT AND BOARD HAVING THE SAME MOUNTED THEREON

CROSS-REFERENCE TO RELATED APPLICATION(S)

The present application claims the benefit of priority to Korean Patent Application No. 10-2020-0115242, filed on Sep. 9, 2020 in the Korean Intellectual Property Office, the entire disclosure of which is incorporated herein by reference.

TECHNICAL FIELD

The present disclosure relates to an electronic component and a board having the same mounted thereon.

BACKGROUND

Multilayer capacitors are used in various electronic devices due to a small size and high capacitance thereof.

Recently, due to fast growing interest in eco-friendly vehicles and electric vehicles, the importance of power driving systems in vehicles is increasing, and accordingly, demand for multilayer capacitors required for power driving systems is also increasing.

Multilayer capacitors are required to have high levels of thermal reliability, electrical reliability, and mechanical reliability such that they are used as components for a vehicle.

With an increase in component-mounting density in a vehicle, there is demand for a multilayer capacitor which may be easily mounted in a limited space while implementing high capacitance and which may be highly resistant to vibrations and deformation.

To improve durability against such vibrations and deformation, a multilayer capacitor may be mounted on a board while being spaced apart from the board using a metal frame.

However, in the case of an electronic component using a metal frame, a bonding portion between an external electrode of a multilayer capacitor and the metal frame may be deteriorated due to thermal and mechanical impacts during board mounting.

In a temperature cycling environment, deterioration may occur between an external electrode and a conductive bonding material and between a metal frame and the conductive bonding material due to a difference in coefficients of thermal expansion, and adhesion of a multilayer capacitor may be deteriorated after an environmental test.

SUMMARY

An aspect of the present disclosure is to provide an electronic component, capable of improving durability of a multilayer capacitor against vibrations and deformation and preventing adhesion from being deteriorated after an environmental test while improving bonding strength between the multilayer capacitor and a metal frame, and a board having the electronic component mounted thereon.

According to an aspect of the present disclosure, an electronic component includes a capacitor body, a pair of external electrodes, respectively disposed on end portions of the capacitor body, a pair of metal frames, respectively disposed to be connected to the pair of external electrodes, and a conductive bonding layer disposed between the external electrode and the metal frame and having a discontinuous region.

The discontinuous region may be formed to have a linear shape.

The discontinuous region may be formed to have a dotted shape.

The discontinuous region may be formed to have a mesh shape.

The discontinuous region may include a plurality of discontinuous regions formed to be spaced apart from each other.

In this case, the discontinuous region may comprise a plurality of discontinuous regions formed to be spaced apart from each other in a width direction of the capacitor body.

In addition, the discontinuous region may include a plurality of discontinuous regions formed to be spaced apart from each other in a thickness direction of the capacitor body.

The capacitor body may include a dielectric layer and a plurality of internal electrodes alternately disposed with the dielectric layer interposed therebetween.

The external electrode may include a head portion, disposed on one surface of the capacitor body, and a band portion extending from the head portion to portions of upper and lower surfaces and portions of both side surfaces of the capacitor body.

The metal frame may include a connection portion, connected to the head portion, and a mounting portion, bent to extend from a lower end of the connection portion.

In addition, $0.40 \leq A/(A+B) \leq 0.90$ in which A is a total area of a bonding region in the conductive bonding layer and B is a total area of a discontinuous region in the conductive bonding layer.

According to another aspect of the present disclosure, a board having an electronic component mounted thereon includes a board, having an upper surface on which a plurality of electrode pads are provided, and an electronic component mounted in such a manner that a single metal frame is connected to each of the plurality of electrode pads.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
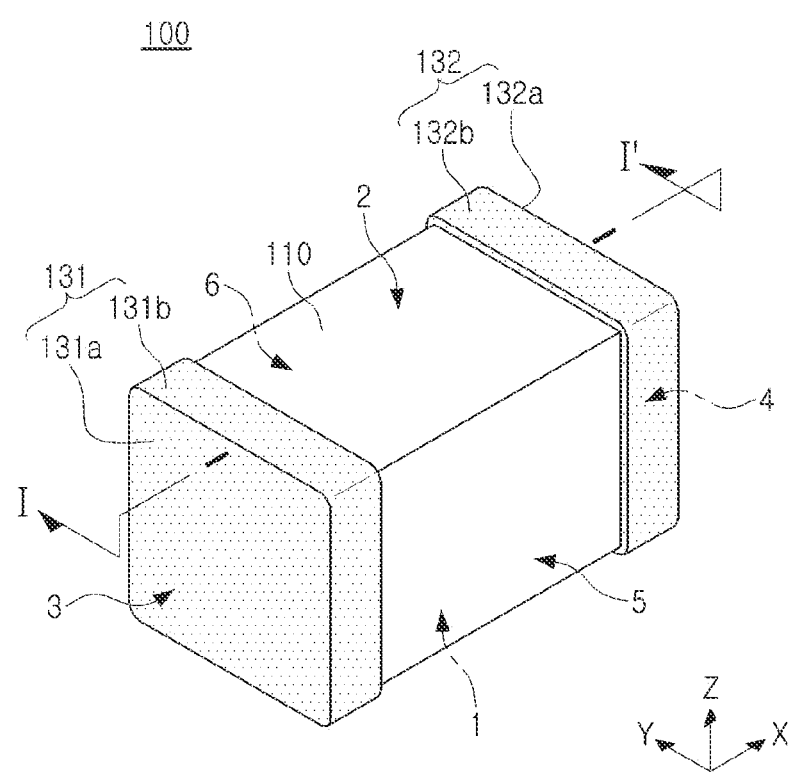
FIG. 1 is a schematic perspective view of a multilayer capacitor applied to an exemplary embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (board), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

When orientations are defined to clearly describe an embodiment in the present disclosure, X, Y, and Z on the drawings indicate a length direction, a width direction, and a thickness direction of a multilayer capacitor and an electronic component, respectively.

Here, in an embodiment, a Z direction may be used as having the same meaning as a stacking direction in which dielectric layers are stacked on each other.

Figure 2A:
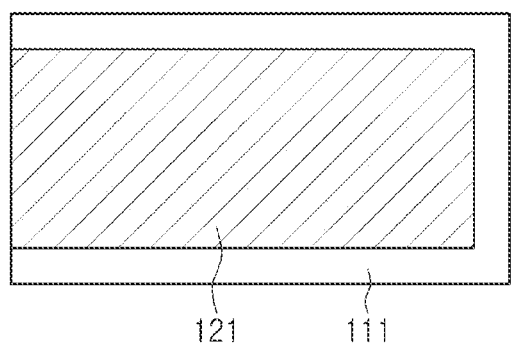
FIGS. 2A and 2B are plan views illustrating first and second internal electrodes, respectively, applied to the multilayer capacitor of FIG. 1.
Figure 2B:
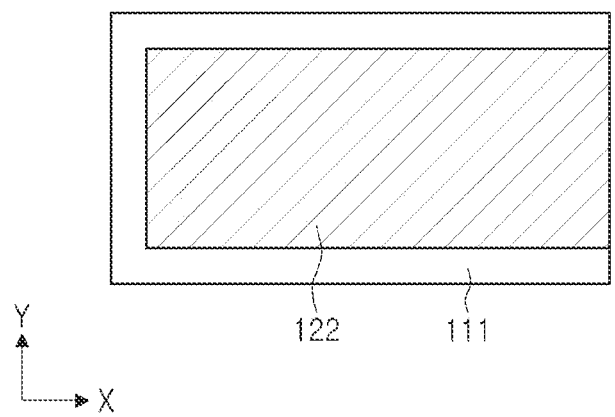
Figure 3:
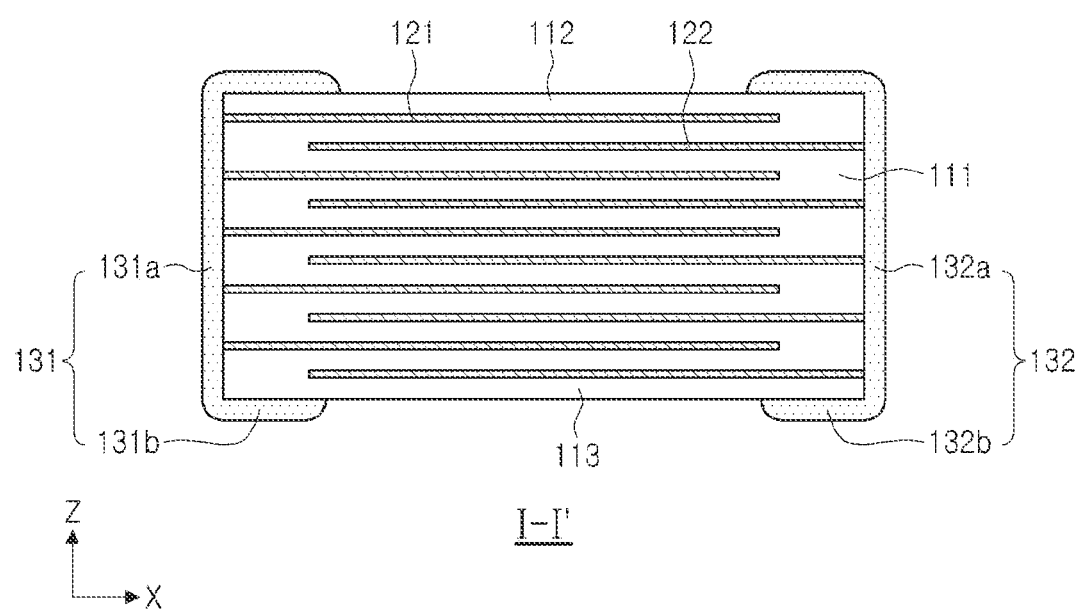
FIG. 3 is a cross-sectional view taken along line I-I' of FIG. 1.

FIG. 1 is a schematic perspective view of a multilayer capacitor applied to an exemplary embodiment, FIGS. 2A and 2B are plan views illustrating a first internal electrode and a second internal electrode, respectively, applied to the multilayer capacitor of FIG. 1, and FIG. 3 is a cross-sectional view taken along line I-I' of FIG. 1.

Hereinafter, a structure of a multilayer capacitor 100, applied to an electronic component of the present embodiment, will be described with reference to FIGS. 1 to 3.

The multilayer capacitor 10 may include a capacitor body 110, and first and second external electrodes 131 and 132, respectively disposed on both end portions of the body capacitor 110, in an X direction defined as a first direction.

The capacitor body 110 may be formed by laminating a plurality of dielectric layers 111 in a Z direction and sintering the laminated dielectric layers 111. Adjacent dielectric layers 111 of the capacitor body 110 are integrated such that boundaries therebetween may not be readily apparent without using a scanning electron microscope (SEM).

The capacitor body 110 may include a plurality of dielectric layers 111 and first and second internal electrodes 121 and 122 alternately disposed in the Z direction with respective dielectric layers 111 interposed therebetween. The first and second internal electrodes 121 and 122 may have polarities opposite to each other.

The capacitor body 110 may include an active region and cover regions 112 and 113.

The active region is a portion contributing to formation of capacitance of a multilayer capacitor.

The cover regions 112 and 113 may be provided on upper and lower portions of the active region in the Z direction as margin portions, respectively. The cover regions 112 and 113 may be provided by laminating a single dielectric layer or at least two dielectric layers on an upper surface and a lower surface of the active region, respectively.

The cover regions 112 and 113 may serve to prevent damage to the first and second internal electrodes 121 and 122 due to physical or chemical stress.

The capacitor body 110 has a shape without limitation, and may have an overall hexahedral shape in some embodiments.

In the present embodiment, as shown in FIG. 1, the capacitor body 110 has a hexahedral shape having a first surface 1 and a second surface 2, opposing each other in the Z direction, a third surface 3 and a fourth surface 4, connected to the first surface 1 and the second surface 2 and opposing each other in the X direction, and a fifth surface 5 and a sixth surface 6, connected to the first surface 1 and the second surface 2 and to the third surface 3 and the fourth surface 4 and opposing each other. The first surface 1 may be a mounting surface.

A shape and a dimension of the capacitor body 110 and the number of laminated dielectric layers 111 are not limited to those illustrated in the drawings of the present embodiment.

The dielectric layer 111 may include ceramic powder, for example, a $BaTiO_3$-based ceramic powder, or the like.

The $BaTiO_3$-based ceramic powder may be $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which calcium (Ca), zirconium (Zr), or the like, is partially dissolved in $BaTiO_3$, but is not limited thereto.

A ceramic additive, an organic solvent, a plasticizer, a binder, a dispersant, and the like, may also be added to the dielectric layers 111.

The ceramic additive may include, for example, a transition metal oxide or a transition metal carbide, a rare earth element, magnesium (Mg), aluminum (Al), or the like.

The first and second internal electrodes 121 and 122 may be electrodes to which voltages having opposite polarities can be applied. Each of the first and second internal electrodes 121 and 122 may be formed on the dielectric layer 111 and may be laminated in the Z direction.

The first and second internal electrodes 121 and 122 may be alternately disposed inside the capacitor body 110 to oppose each other in the Z direction with a single dielectric layer 111 interposed therebetween. In this case, the first and second internal electrodes 121 and 122 may be electrically insulated from each other by the dielectric layer 111 disposed therebetween.

In the present embodiment, a plurality of internal electrodes are illustrated and described as being laminated in the Z direction. However, the present disclosure is not limited thereto and may be applied to a structure in which internal electrodes are laminated in the Y direction, as necessary.

One end of the first internal electrode 121 may be exposed through the third surface 3 of the capacitor body 110. The end portion of the first internal electrode 121, exposed through the third surface 3 of the capacitor body 110, may be connected to the first external electrode 131, disposed on one end portion of the capacitor body 110 in the X direction, to be electrically connected thereto.

One end portion of the second internal electrode 121 may be exposed through the fourth surface 4 of the capacitor body 110. The end portion of the second internal electrode 122, exposed through the fourth surface 4 of the capacitor body 110, may be connected to the second external electrode 132, disposed on one end portion of the capacitor body 110 in the X direction, to be electrically connected thereto.

According to the above configuration, when a predetermined voltage is applied to the first and second external electrodes 131 and 132, charges are accumulated between the first and second internal electrodes 121 and 122.

In this case, the capacitance of the multilayer capacitor 100 may be proportional to an area of overlap between the first and second internal electrodes 121 and 122, overlapping in the Z direction in the active region.

A material, forming the first and second internal electrodes 121 and 122, is not necessarily limited.

For example, the first and second internal electrodes 121 and 122 may be formed using a precious metal material or a conductive paste formed of at least one of nickel (Ni) and copper (Cu). The precious metal material may be platinum (Pt), palladium (Pd), a palladium-silver (Pd—Ag) alloy, or the like. Other conductive materials are contemplated within the scope of the present disclosure.

In this case, a method of printing the conductive paste may be such as screen printing or gravure printing may be used, but the present disclosure is not limited thereto.

Voltages, having opposite polarities, may be provided to the first and second external electrodes 131 and 132. The first and second external electrodes 131 and 132 may be disposed on both end portions of the body 110 in the X direction and may be connected to exposed portions of the first and second electrodes 121 and 122, respectively, to be electrically connected to each other.

The first external electrode 131 may include a first head portion 131a and a first band portion 131b.

The first head portion 131a may be disposed on the third surface 3 of the body 110. The first head portion 131 may be in contact with an end portion exposed to an external entity through the third surface 3 of the capacitor body 110 in the first internal electrode 121 to electrically connect the first internal electrode 121 and the first external electrode 131 to each other.

The first band portion 131b is a portion extending from the first band portion 131a to portions of the first, second, fifth, and sixth surfaces 1, 2, 5, and 6, of the body 110. The first band portion may serve to improve adhesion strength.

The second external electrode 132 may include a second head portion 132a and a second band portion 132b.

The second head portion 132a may be disposed on the fourth surface 4 of the body 110. The second head portion 132a may be in contact with an end portion exposed to an external entity through the fourth surface 4 of the body 110 in the second internal electrode 122 to electrically connect the second internal electrode 122 and the second external electrode 132 to each other.

The second band portion 132b is a portion extending from the second band portion 132a to a portion of the first, second, fifth, and sixth surfaces 1, 2, 5, and 6 of the body 110. The second band portion 132b may serve to improve adhesion strength.

The first and second external electrodes 131 and 132 may further include a plating layer.

The plating layer includes first and second nickel (Ni) plating layers, disposed on the capacitor body 110, and first and second tin (Sn) plating layers, respectively covering the first and second nickel (Ni) plating layers.

Figure 4:
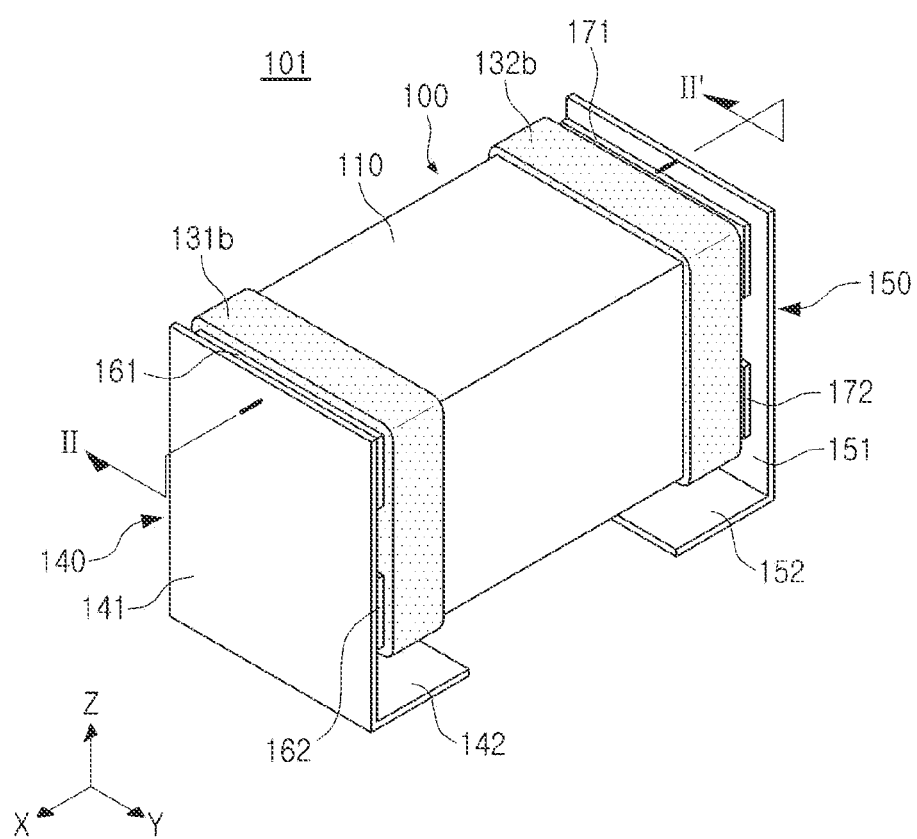
FIG. 4 is a perspective view illustrating a schematic structure of an electronic component according to an exemplary embodiment of the present disclosure.
Figure 5:
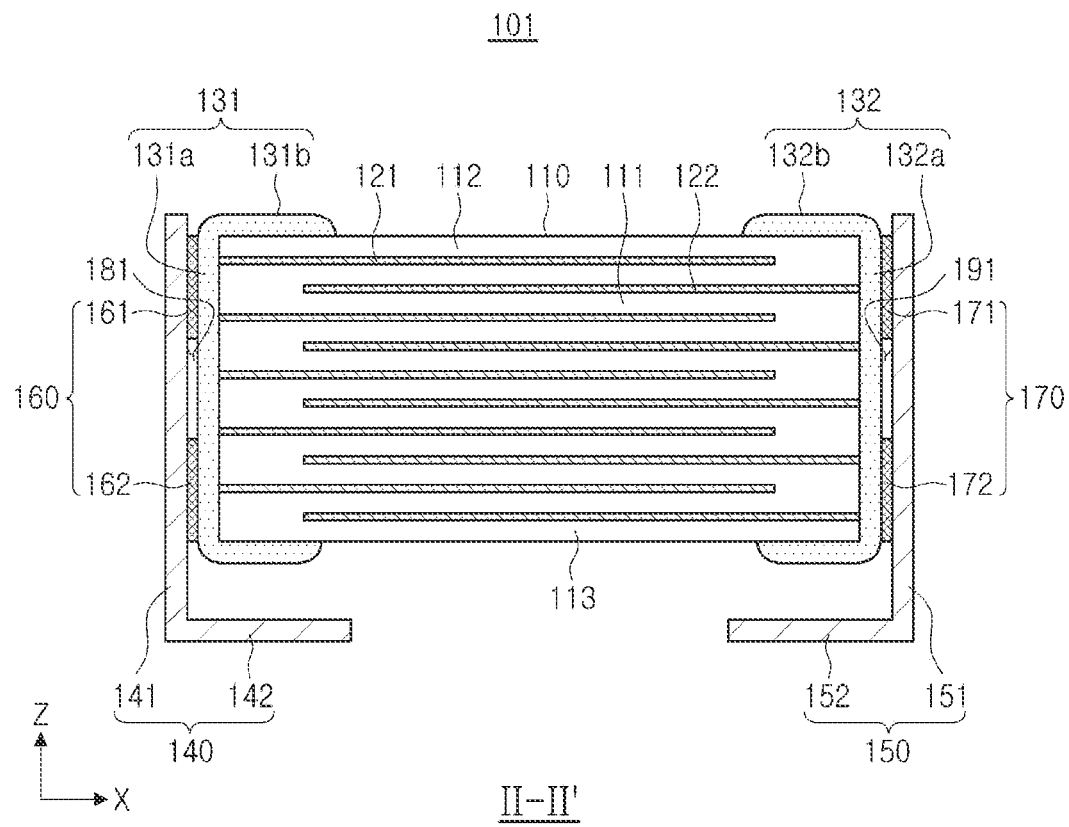
FIG. 5 is a cross-sectional view taken along line II-II' of FIG. 4.
Figure 6:
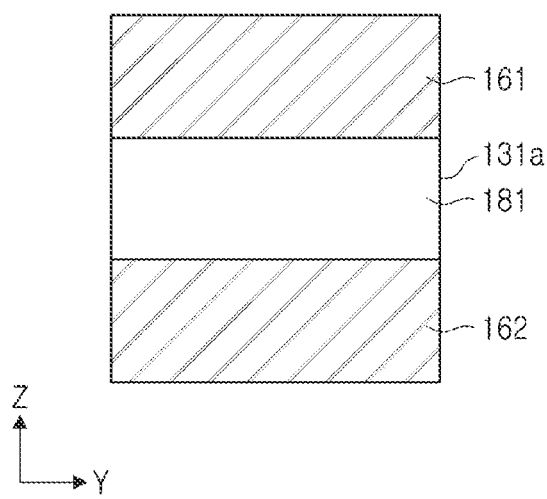
FIG. 6 is a side view illustrating a first head portion in which a first metal frame is separated from FIG. 5 and a first conductive bonding layer is formed.

FIG. 4 is a perspective view illustrating a schematic structure of an electronic component according to an exemplary embodiment, FIG. 5 is a cross-sectional view taken along line II-II' of FIG. 4, and FIG. 6 is a side view illustrating a first head portion in which a first metal frame is separated from FIG. 5 and a first conductive bonding layer is formed.

Referring to FIGS. 4 to 6, an electronic component 101 according to the present embodiment may include a multi-layer capacitor 100, first and second metal frames 140 and 150, respectively connected to first and second external electrodes 131 and 132 of the multilayer capacitor 100, a first conductive bonding layer 160 disposed between the first external electrode 131 and the first metal frame 140, and a second conductive bonding layer 170 disposed between the second external electrode 132 and the second metal frame 150.

In this case, each of the first and second conductive bonding layers 160 and 170 may have a plurality of discontinuous regions formed to be spaced apart from each other.

The first metal frame 140 may include a first connection portion 141 and a first mounting portion 142.

The first connection portion 141 is a portion bonding to the first head portion 131a of the first external electrode 131a to be physically connected thereto, and is electrically connected to the head portion 131a of the first external electrode 131.

In this case, the first conductive bonding layer 160 may be disposed between the first head portion 131a of the first external electrode 131 and the first connection portion 141.

The first conductive bonding layer 160 may be formed of a high-temperature solder, a conductive bonding material, or the like, but the present disclosure is not limited thereto.

In the present embodiment, the discontinuous region of the first conductive bonding layer 160 may be formed in a linear shape, and may be formed to be linear overall in a Y direction.

In the present embodiment, two first conductive bonding layers 161 and 162 may be disposed in a linear shape above and below a discontinuous region 181 with the discontinuous region 181 interposed therebetween, respectively.

In this case, the first conductive bonding layer 161 disposed thereabove and the first conductive bonding layer 162 disposed therebelow may be formed to have the same width in the Z direction. Alternatively, the first conductive bonding layer 161 disposed thereabove and the first conductive bonding layer 162 disposed therebelow may be formed to have different widths in the Z direction.

Accordingly, a space portion, in which the first head portion 131a of the first external electrode 131 and the first connection portion 141 of the first metal frame 140 are not bonded to each other, may be provided between the first head portion 131a and the first connection portion 141 by the discontinuous region 181.

For example, a region in which the first conductive layer 160 is not bonded to the first head portion 131a may be present in an area in which the first conductive bonding layer 160 and the first head portion 131a oppose each other, and regions 161 and 162 in which the first conductive bonding layer 160 is bonded to the first head portion 131a may be divided into a plurality of regions spaced apart from each other.

Thermal stress may be created in a bonding interface between the first conductive bonding layer 160 and the first external electrode 131, due to a difference in coefficients of thermal expansion between the first conductive bonding layer 160 and the first external electrode 131.

According to the present embodiment, since a length of a portion in which the first conductive bonding layer 160 and the first head portion 131a of the first external electrode 131 are continuously bonded to each other is decreased by a discontinuous region, thermal stress depending on a coefficient of thermal expansion may be reduced in a temperature cycling environment. Thus, deterioration in the bonding interface between the first conductive bonding layer 160 and the first head 131a may be alleviated.

Similarly, thermal stress may be created in a bonding interface between the first conductive bonding layer 160 and the first metal frame 140, due to a difference in coefficients of thermal expansion between the first conductive bonding layer 160 and the first metal frame 140.

According to the present embodiment, since a length of a portion in which the first conductive bonding layer 160 and the first connection portion 141 are continuously bonded to each other is decreased by a discontinuous region, thermal stress depending on a coefficient of thermal expansion coefficient in a temperature cycling environment may be reduced in a temperature cycling environment. Thus, deterioration in the bonding interface between the first conductive bonding layer 160 and the first connection portion 141 may be alleviated.

The first mounting portion 142 may be bent from a lower end of the first connection portion 141 in an X direction, a first direction, and may extend in a horizontal direction to a mounting surface.

The first mounting portion 142 may serve as a connection terminal when the electronic component 101 is mounted on a board.

The first mounting portion 142 may be disposed to be spaced apart from a lower end of the multilayer capacitor 100.

The second metal frame 150 may include a second connection portion 151 and a second mounting portion 152.

The second connection portion 151 may be physically connected to the second head portion 132a of the second external electrode 132, and may be electrically connected to the second head portion 132a of the second external electrode 132.

In this case, a second conductive bonding layer 170 may be disposed between the second head portion 132a of the second external electrode 132 and the second connection portion 151.

The second conductive bonding layer 170 may be formed of a high-temperature solder, a conductive bonding material, or the like, but the present disclosure is not limited thereto.

In the present embodiment, the discontinuous region of the second conductive bonding layer 170 may be formed in a linear shape, and may be formed to be linear overall in the Y direction.

In the present embodiment, two second conductive bonding layers 171 and 172 may be disposed in a linear shape above and below a discontinuous region 191 with the discontinuous region 191 interposed therebetween, respectively.

In this case, the second conductive bonding layer 171 disposed thereabove and the second conductive bonding layer 172 disposed therebelow may be formed to have the same width in the Z direction. Alternatively, the second conductive bonding layer 171 disposed thereabove and the second conductive bonding layer 172 disposed therebelow may be formed to have different widths in the Z direction.

Accordingly, a space portion, in which the second head portion 132a of the second external electrode 132 and the second connection portion 151 of the second metal frame 150 are not bonded to each other, may be provided between the second head portion 132a and the second connection portion 151 by the discontinuous region 191.

For example, a region in which the second conductive layer 170 is not bonded to the second head portion 132a may be present in an area in which the second conductive bonding layer 170 and the second head portion 132a oppose each other, and regions 171 and 172 in which the second conductive bonding layer 170 is bonded to the second head portion 132a may be divided into a plurality of regions spaced apart from each other.

Thermal stress may be created in a bonding interface between the second conductive bonding layer 170 and the second external electrode 132, due to a difference in coefficients of thermal expansion between the second conductive bonding layer 170 and the second external electrode 132.

According to the present embodiment, since a length of a portion in which the second conductive bonding layer 170 and the second head portion 132a of the second external electrode 132 are continuously bonded to each other is decreased by a discontinuous region, thermal stress depending on a coefficient of thermal expansion may be reduced in a temperature cycling environment. Thus, deterioration in the bonding interface between the second conductive bonding layer 170 and the second head 132a may be alleviated.

Similarly, thermal stress may be created in a bonding interface between the second conductive bonding layer 170 and the second metal frame 150, due to a difference in coefficients of thermal expansion between the second conductive bonding layer 170 and the second metal frame 150.

According to the present embodiment, since a length of a portion in which the second conductive bonding layer 170 and the second connection portion 151 are continuously bonded to each other is decreased by a discontinuous region, thermal stress depending on a coefficient of thermal expansion coefficient in a temperature cycling environment may be reduced in a temperature cycling environment. Thus, deterioration in the bonding interface between the second conductive bonding layer 170 and the second connection portion 151 may be alleviated.

The second mounting portion 142 may be bent from a lower end of the second connection portion 141 in the X direction, the first direction, and may extend in a horizontal direction to a mounting surface.

The second mounting portion 152 may serve as a connection terminal when the electronic component 101 is mounted on a board.

The second mounting portion 152 may be disposed to be spaced apart from a lower end of the multilayer capacitor 100.

In the present disclosure, discontinuous regions of first and second conductive bonding layers may be patterned into various structures to be transformed into various forms.

The first conductive bonding layer and the second conductive bonding layer are substantially the same, except that the second conductive bonding layer is disposed on a head portion of a second external electrode. Accordingly, a description will be given while focusing on the first conductive bonding layer, but is considered to include a description of the second conductive bonding layer.

Figure 7:
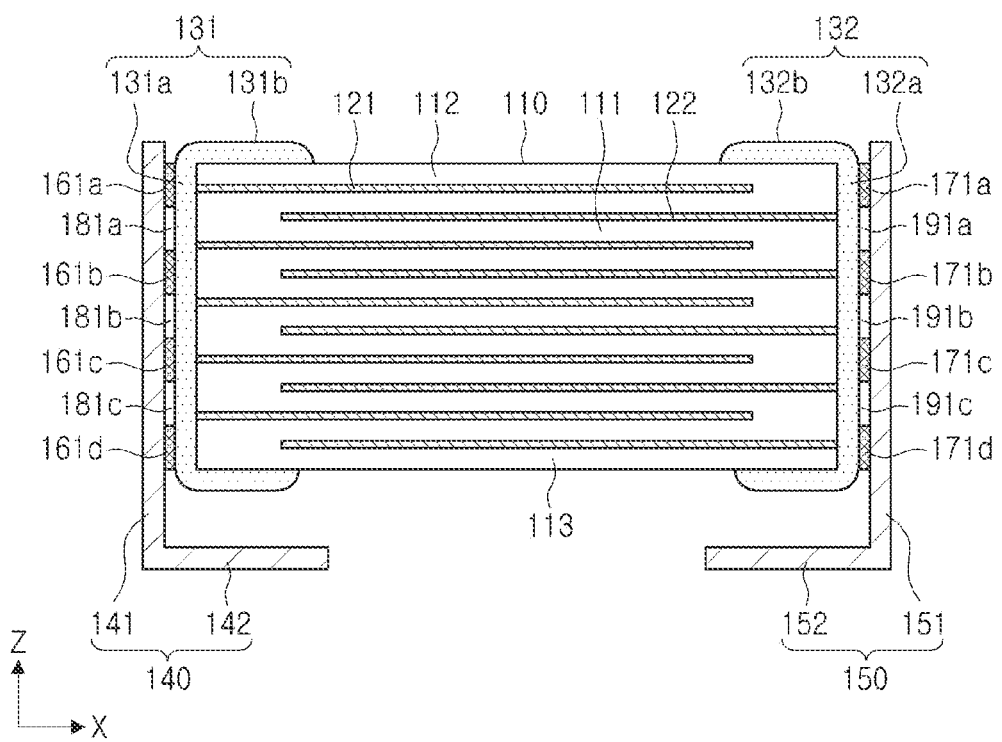
FIG. 7 is a cross-sectional view of an electronic component according to another exemplary embodiment of the present disclosure.
Figure 8:
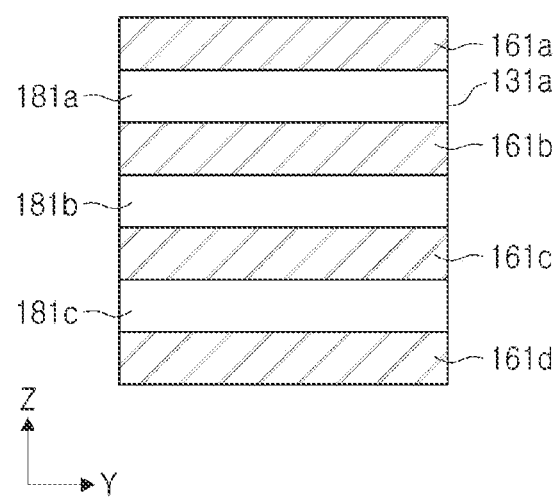
FIG. 8 is a side view illustrating a first head portion in which a first metal frame is separated from FIG. 7 and a first conductive bonding layer is formed.

FIG. 7 is a cross-sectional view of an electronic component according to another exemplary embodiment, and FIG. 8 is a side view illustrating a first head portion in which a first metal frame is separated from FIG. 7 and a first conductive bonding layer is formed.

Referring to FIGS. 7 and 8, a discontinuous region may be formed in a linear shape, and may be formed to be linear overall in a Y direction.

In addition, a plurality of discontinuous regions may be disposed in a Z direction at intervals to be separated from each other.

In the present embodiment, a plurality of first conductive bonding layers 161a, 161b, 161c, and 161d may be disposed to have a linear shape while being spaced apart from each other, with a plurality of discontinuous regions 181a, 181b, and 181c, provided on a first head portion 131a in a Z direction, interposed therebetween.

In this case, the plurality of discontinuous regions 181a, 181b, and 181c may be formed to have the same width in the Z direction.

As another example, unlike what is illustrated in the drawings, the plurality of discontinuous regions 181a, 181b, and 181c may be formed such that some of the discontinuous regions 181a, 181b, and 181c have the same width in the Z direction, or all of the discontinuous regions 181a, 181b, and 181c may have different widths in the Z direction.

In addition, the plurality of first conductive bonding layers 161a, 161b, 161c, and 161d may be formed to have the same width in the Z direction.

As another example, unlike what is illustrated in the drawings, the plurality of first conductive bonding layers 161a, 161b, 161c, and 161d may be formed such that some of the first conductive bonding layers 161a, 161b, 161c, and 161d are formed to have the same width in the Z direction, or all of the first conductive bonding layers 161a, 161b, 161c, and 161d have different widths in the Z direction.

Accordingly, a plurality of space portions may be provided between the first head portion 131a and a first connection portion 141 of the first metal frame 140 by the plurality of discontinuous regions 181a, 181b, and 181c.

A plurality of second conductive bonding layers 171a, 171b, 171c, and 171d may be disposed to have a linear shape while being spaced apart from each other, with a plurality of discontinuous regions 191a, 191b, and 191c, provided on a second head portion 131a in the Z direction, interposed therebetween.

In this case, the plurality of discontinuous regions 191a, 191b, and 191c may be formed to have the same width in the Z direction.

As another example, unlike what is illustrated in the drawings, the plurality of discontinuous regions 191a, 191b, and 191c may be formed such that some of the discontinuous regions 191a, 191b, and 191c have the same width in the Z direction, or all of the discontinuous regions 191a, 191b, and 191c may have different widths in the Z direction.

In addition, the plurality of second conductive bonding layers 171a, 171b, 171c, and 171d may be formed to have the same width in the Z direction.

As another example, unlike what is illustrated in the drawings, the plurality of second conductive bonding layers 171a, 171b, 171c, and 171d may be formed such that some of the second conductive bonding layers 171a, 171b, 171c, and 171d are formed to have the same width in the Z direction, or all of the second conductive bonding layers 171a, 171b, 171c, and 171d have different widths in the Z direction.

Accordingly, a plurality of space portions may be provided between the second head portion 132a and a second connection portion 151 of the second metal frame 150 by the plurality of discontinuous regions 191a, 191b, and 191c.

Figure 9:
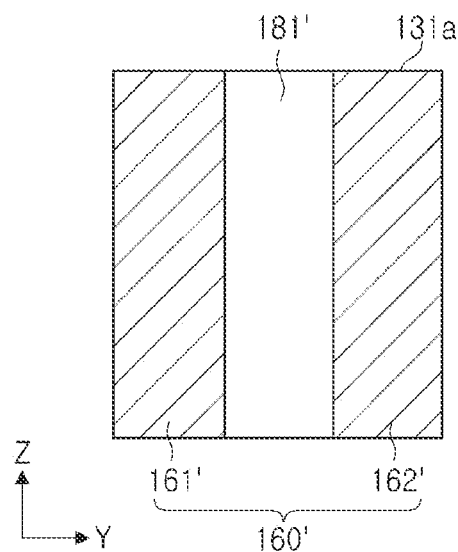
FIGS. 9 and 10 are side views illustrating various modified examples of a conductive bonding layer, respectively.
Figure 10:
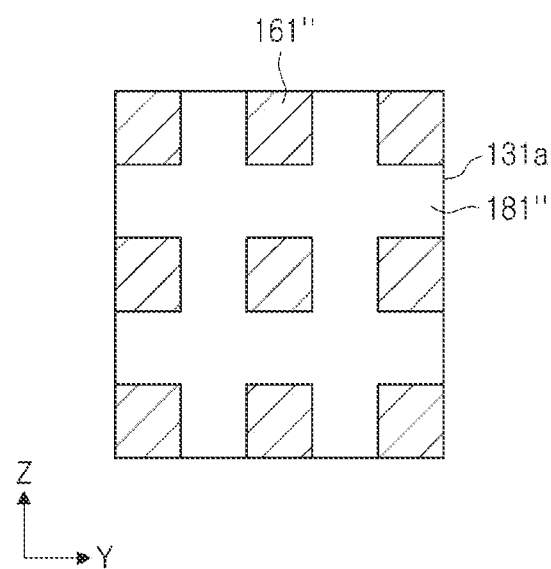

FIGS. 9 and 10 are side views illustrating various modified examples of a conductive bonding layer, respectively.

Referring to FIG. 9, in a first conductive bonding layer 160' disposed on a first head portion 131a, a discontinuous region 181' may be formed in a linear shape and may be formed to be linear overall in a Z direction.

Similarly, in a second conductive bonding layer disposed on a second head portion, a discontinuous region may be formed in a linear shape, and may be formed to be linear overall in the Z direction.

As another example, the discontinuous regions may be disposed such that a plurality of discontinuous regions are spaced apart from each other in a Y direction.

In this case, a plurality of first conductive bonding layers may be disposed to be spaced apart from each other on the first head portion at intervals in the Y direction with respective discontinuous regions interposed therebetween.

A plurality of second conductive bonding layers may be disposed on a second head portion in the Y direction at intervals with respective discontinuous regions interposed therebetween.

Referring to FIG. 10, a first conductive bonding layer 161" may be formed in the form of a plurality of dots disposed to be spaced apart from each other.

As illustrated in FIG. 10, the plurality of first conductive bonding layers 161" may be disposed on a first head portion 131a in a grid pattern, for example. Thus, the discontinuous region 181" may be formed to have a mesh shape overall.

Referring to FIG. 6 as an example, 0.40≤A/(A+B)≤0.90 in which 'A' is a total area of the bonding region of the first or second conductive bonding layers 160 and 170 in the first head portion 131a or the second head portions 132a, and 'B' is a total area of the discontinuous regions 181 and 191 in the first conductive bonding layer 160 or the second conductive bonding layer 170. In other words, the area covered by the conductive bonding layer is in a range from 35% to 95%, preferably in a range from 40% to 90%, of the total area of the corresponding head portion.

Figure 12:
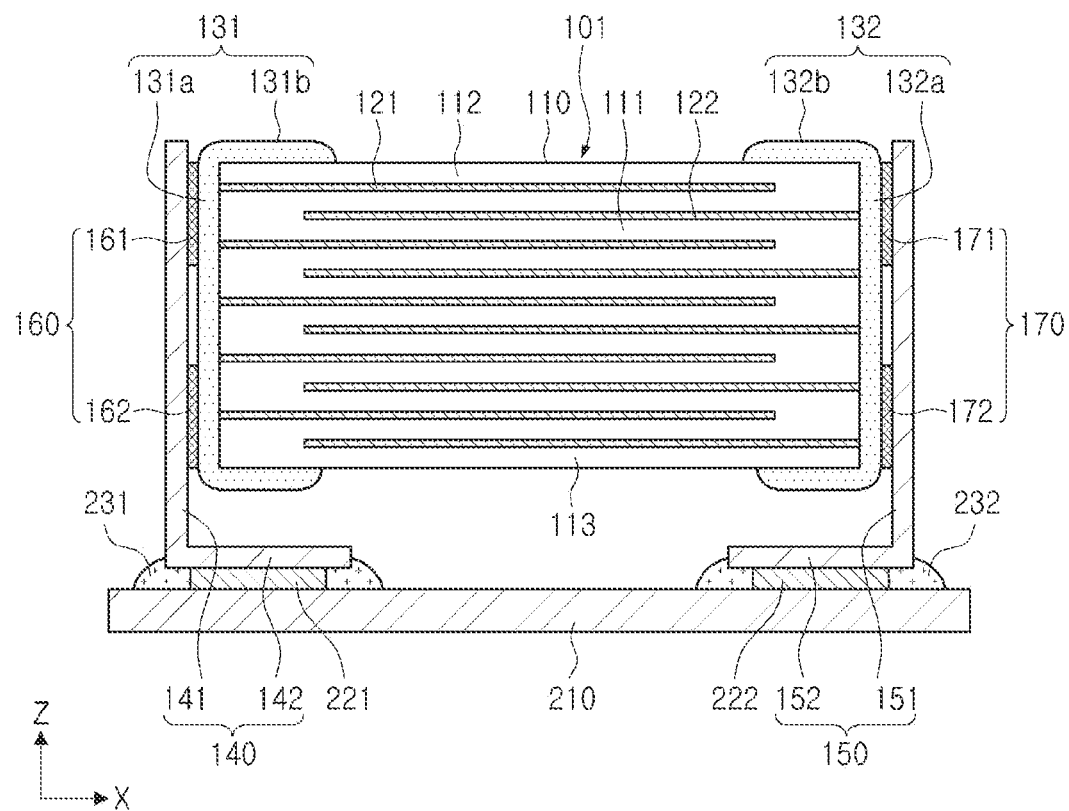
FIG. 12 is a cross-sectional view illustrating a state in which the electronic component of FIG. 5 is mounted on a board.

FIG. 12 is a cross-sectional view illustrating a state in which the electronic component of FIG. 5 is mounted on a board.

Referring to FIG. 12, a mounting board according to the present embodiment may include a board 210 and first and second electrode pads 221 and 222 disposed to be spaced apart from each other on an upper surface of the board 210.

An electronic component 101 may be mounted on the board 210 by connecting first and second mounting portions 142 and 152 of first and second metal frames 140 and 150 in the state in which the first and second mounting portions 142 and 152 are in contact with the first and second electrode pads 221 and 222, respectively.

In this case, the first mounting portion 142 may be bonded to the first electrode pad 221 by a solder 231 to be electrically and physically connected thereto, and the second mounting portion 152 may be bonded to the second electrode pad 222 by a solder 232 to be electrically and physically connected thereto.

A multilayer capacitor according to the related art has a structure in which a solder allows an external electrode and a board to be in direct contact with each other during board mounting.

Accordingly, since thermal or mechanical deformation occurring in the board is directly transferred to a multilayer capacitor, it may be difficult for the multilayer capacitor to secure a high level of reliability.

In the electronic component 101 according to the present embodiment, the first and second metal frames 140 and 150 may be respectively bonded to both end portions of the multilayer capacitor 100 the first and second metal frames 140 and 150 to secure a gap between the first and second external electrodes 131 and 132 of the multilayer capacitor 100, and the board 210.

Accordingly, when the electronic component 101 is mounted on the substrate 210, stress from the substrate 210 may be prevented from being directly transferred to the multilayer capacitor 100 to improve thermal reliability, electrical reliability, mechanical reliability, and the like of the electronic component 101.

However, in the case of an electronic component using a metal frame, a conductive bonding layer is disposed between the metal frame and an external electrode to form a bonding interface between the metal frame and the conductive bonding layer and a bonding interface between the external electrode and the conductive bonding layer.

Under an environmental condition such as a temperature cycling or the like, thermal stress may be created in the bonding interface between the conductive bonding layer and the metal frame and in the bonding interface between the conductive bonding layer and the external electrode, due to a difference in coefficients of thermal expansion.

Since such thermal stress deteriorates the bonding interfaces to cause the metal frame and the external electrode to be separated from each other, a physical or electrical defect may occur in the electronic component.

In general, in an electronic component using a metal frame, an integral conductive bonding layer is formed on a head portion of an external electrode of a multilayer capacitor to be continuously connected to an entire region opposing a connection portion of the metal frame.

Meanwhile, in the present embodiment, a conductive bonding layer formed in a head portion of an external electrode has a discontinuous region. Therefore, a conductive bonding layer formed on a single head portion is divided into a plurality of conductive bonding layers spaced apart from each other, rather than being an integral conductive bonding layer continuously connected.

In an electronic component according to the related art, since thermal stress is applied to an overall length in which a conductive bonding layer and a head portion of an external electrode having different coefficients of thermal expansion, thermal stress in a temperature cycling environment may be increased.

Meanwhile, in the present embodiment, a length at which thermal stress is created in the bonding surface of the conductive bonding layer and the external electrode may be decreased due to a discontinuous regions in which the conductive bonding layer and the head portion of the external electrode are not bonded to each other but are separated from each other. Therefore, possibility of deterioration of the bonding surface, occurring due to thermal stress in a temperature cycling environment, may be reduced.

As a result, a continuous length of a portion, in which the external electrode and the metal frame are bonded to each other, may be decreased due to the discontinuous region. Accordingly, thermal stress depending on a coefficient of thermal expansion may be dispersed and reduced to suppress deterioration in the bonding interface between the conductive bonding layer and the external electrode in the temperature cycling environment.

As described above, a metal frame structure may prevent a decrease in reliability and warpage deformation resistance of an electronic component caused by external stress and to suppress deterioration of a bonding interface occurring due to a difference in coefficients of thermal expansion in the bonding interface between the metal frame and the conductive bonding layer and the bonding interface between the external electrode and the conductive bonding layer.

Therefore, according to the present embodiment, bonding strength of the multilayer capacitor and the metal frame may be secured to a certain level or higher while improving reliability of the electronic component, and interface deterioration in a temperature cycling environment may be suppressed to improve adhesion strength.

Figure 11:
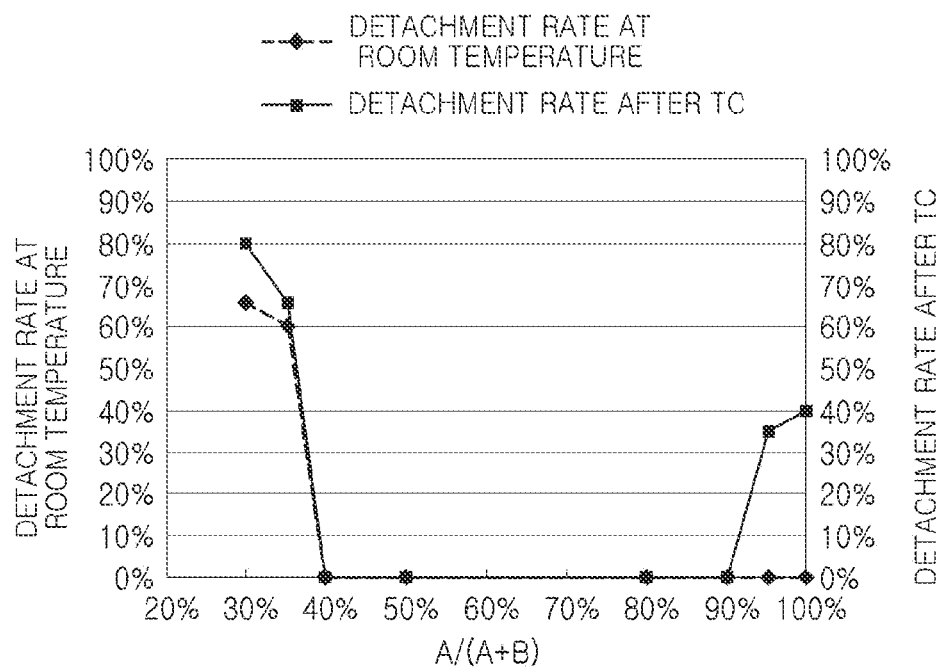
FIG. 11 is a graph illustrating a detachment rate at room temperature and a detachment rate after temperature cycling (TC), depending on a ratio of a bonding region in a conductive bonding layer.

FIG. 11 is a graph illustrating a detachment rate at room temperature and a detachment rate after temperature cycling (TC), depending on a ratio of a bonding region in a conductive bonding layer.

In the conductive bonding layer, a width of a bonding region to which a conductive bonding material is applied and a width of a discontinuous region, a non-bonding region, may be measured by the following method.

In a multilayer capacitor to which a metal frame is bonded, a head portion of an external electrode of the multilayer capacitor may be polished in a direction, perpendicular to a mounting surface of a board, to a portion having a half dimension in a width direction. In a polished surface, a portion to which the conductive bonding material is applied and a portion to which the conductive bonding material is not applied may be measured by an optical microscope.

In this case, when a bonding region between a conductive bonding layer and a head portion of an external electrode is significantly small, adhesion strength of the external electrode may be reduced. Meanwhile, when a discontinuous region, a non-bonding region, is significantly small, an effect of alleviating thermal stress may be reduced.

For example, there is an appropriate ratio between the bonding region between the conductive bonding layer and the head portion of the external electrode and the discontinuous region. To confirm this, adhesion strengths of a metal frame and a multilayer capacitor depending on a ratio between the bonding region and the discontinuous region were evaluated.

To confirm the adhesion strength of the multilayer capacitor, force of 10N was applied at a rate of 1 mm/min for 10 seconds after mounting 20 electronic components on a printed circuit board (PCB) for each condition using a chip mounter. An indication regarding whether a multilayer capacitor was separated from the metal frame was evaluated as a detachment rate.

When 'A' is the sum of total area of bonding regions of a conductive bonding layer observed in a polished cross section and 'B' is the sum of total areas of discontinuous regions, non-bonding regions, adhesion strength at room temperature and adhesion strength after 1000 cycles of temperature (−40 to 125° C.), depending on a ratio of A to (A+B) (i.e., A/(A+B)), were tested. The ratio A/(A+B) indicates the ratio of the total area covered by the conductive bonding layer to the total area of the corresponding head portion of the external electrodes.

In addition, a detachment rate of a room-temperature test and a detachment rate after a temperature cycling (−40 to 25° C.) are illustrated in FIG. 11 and Table 11.

TABLE 1

| A/(A + B) | 100% | 95% | 90% | 80% | 50% | 40% | 35% | 30% |
|---|---|---|---|---|---|---|---|---|
| Detachment Rate at Room Temperature (%) | 0.0 | 0.0 | 0.0 | 0.0 | 0.0 | 0.0 | 60.0 | 65.0 |
| Detachment Rate after TC (%) | 40.0 | 35.0 | 0.0 | 0.0 | 0.0 | 0.0 | 65.0 | 80.0 |

Referring to Table 1 and FIG. 11, in a test of adhesion strength at room temperature, a conductive bonding layer did not support an external electrode and a multilayer capacitor was separated from a metal frame (that is, detachment occurred) in a region in which A/(A+B) was 35% or less.

In addition, the multilayer capacitor was not separated from the metal frame (that is, detachment did not occur) under the condition that A/(A+B) was 40% or more at which a discontinuous region was decreased and a total region of the conductive bonding layer was increased.

However, in a test of adhesion strength after a temperature cycling, a multilayer capacitor was separated from a metal frame (that is, detachment occurred) in a region in which A/(A+B) was 35% or less as well as a region in which A/(A+B) was 94% or more at which a total region of the conductive bonding layer was relatively large.

For example, when a bonding region between the conductive bonding layer and a head portion of the external electrode is significantly large, the adhesion strength at room temperature is high, but the adhesion strength in a temperature cycling environment is reduced as the bonding region between the conductive bonding layer and the head portion of the external electrode is deteriorated.

Accordingly, to form a discontinuous region having a predetermined level in the conductive bonding layer is effective in preventing deterioration in the bonding region between the conductive bonding layer and the head portion of the external electrode in the temperature cycling environment.

According to the present embodiment, when A/(A+B) is 0.40 to 0.90, adhesion strength at room temperature may be secured in a structure of a multilayer capacitor to which a metal frame is bonded and interface deterioration in a temperature cycling environment may be suppressed to improve adhesion strength after an environmental test.

As described above, durability of a multilayer capacitor against vibrations and deformation may be improved, and adhesion may be prevented from being deteriorated after an environmental test while improving bonding strength between the multilayer capacitor and a metal frame. As a result, reliability of an electronic component may be improved.

While exemplary embodiments have been shown and described above, it will be apparent to those skilled in the art that modifications and variations could be made without departing from the scope of the present disclosure as defined by the appended claims.

What is claimed is:

1. An electronic component comprising:
    a capacitor body;
    first and second external electrodes disposed on end portions of the capacitor body, respectively;
    first and second metal frames disposed to be connected to the first and second external electrodes, respectively; and
    a first conductive bonding layer disposed between the first external electrode and the first metal frame and having a discontinuous region,
    wherein conductive bonding portions of the first conductive bonding layer include two or more portions spaced apart from each other, and
    $0.40 \leq A/(A+B) \leq 0.90$ in which A is a total area of the conductive bonding portions in the first conductive bonding layer and B is a total area of the discontinuous region in the first conductive bonding layer.

2. The electronic component of claim 1, wherein the discontinuous region has a linear shape.

3. The electronic component of claim 1, wherein the conductive bonding portions have a dotted shape.

4. The electronic component of claim 1, wherein the conductive bonding portions have a mesh shape.

5. The electronic component of claim 1, wherein the discontinuous region comprises a plurality of discontinuous regions spaced apart from each other.

6. The electronic component of claim 5, wherein the discontinuous region comprises a plurality of discontinuous regions spaced apart from each other in a width direction of the capacitor body.

7. The electronic component of claim 5, wherein the first metal frame comprises a first connection portion connected to the first external electrode through the first conductive bonding layer, and a first mounting portion bent to extend from a lower end of the first connection portion, the first connection portion has an upper end opposing the lower end in a thickness direction of the capacitor body, and the discontinuous region comprises a plurality of discontinuous regions spaced apart from each other in the thickness direction of the capacitor body.

8. The electronic component of claim 1, wherein the capacitor body comprises a dielectric layer and a plurality of internal electrodes alternately disposed with the dielectric layer interposed therebetween.

9. The electronic component of claim 1, wherein the first external electrode comprises:
a head portion disposed on one surface of the capacitor body; and
a band portion extending from the head portion to portions of upper and lower surfaces and portions of both side surfaces of the capacitor body.

10. The electronic component of claim 9, wherein the first metal frame comprises:
a connection portion connected to the head portion; and
a mounting portion, bent to extend from a lower end of the connection portion.

11. A board having an electronic component mounted thereon, comprising:
a board having an upper surface on which first and second electrode pads are provided; and
the electronic component of claim 1 mounted on the board,
wherein the first and second metal frames are respectively connected to the first and second electrode pads.

12. The electronic component of claim 1, further comprising a second conductive bonding layer disposed between the second external electrode and the second metal frame and having a discontinuous region,
wherein the second metal frame comprises a second connection portion connected to the second external electrode through the second conductive bonding layer, and a second mounting portion bent to extend from a lower end of the second connection portion.

13. An electronic component, comprising:
a pair of metal frames each having a connecting surface, the pair of metal frames being spaced apart from each other and disposed such that the connecting surfaces face each other;
a conductive bonding layer disposed on each of the connecting surfaces, the conductive bonding layer having a plurality of discontinuously disposed conductive bonding portions; and
a capacitor having a pair of external electrodes disposed on opposing end surfaces thereof, the capacitor being disposed between the pair of metal frames such that the external electrodes contact the plurality of conductive bonding portions of corresponding metal frames,
wherein a total area covered by the plurality of conductive bonding portions of the conductive bonding layer disposed between one of the pair of metal frames and one of the pair of external electrodes is in a range from 40% to 90% of a total area of the one of the pair of external electrodes facing the connecting surface.

14. The electronic component of claim 13, wherein the capacitor is a multilayer ceramic capacitor.

15. The electronic component of claim 13, wherein each of the plurality of conductive bonding portions has a polygonal shape.

16. The electronic component of claim 13, wherein each of the pair of metal frames includes a mounting portion extending perpendicularly from the connecting surface and toward the other of the pair of metal frames,
wherein the capacitor is disposed to be spaced apart from the mounting portions.

17. The electronic component of claim 13, wherein the capacitor includes internal electrodes disposed perpendicular to the connecting surface and the mounting portions.

18. The electronic component of claim 13, wherein the capacitor includes internal electrodes disposed parallel to the mounting portions and perpendicular to the connecting surface.

19. The electronic component of claim 13, wherein a first metal frame of the pair of the metal frames comprises a first connection portion connected to a first external electrode of the pair of external electrodes, and a first mounting portion bent to extend, in a length direction of the capacitor body, from a lower end of the first connection portion,
a second metal frame of the pair of the metal frames comprises a second connection portion connected to a second external electrode of the pair of external electrodes, and a second mounting portion bent to extend from a lower end of the second connection portion towards the first mounting portion,
the first connection portion has an upper end opposing the lower end of the first connection portion in a thickness direction of the capacitor body,
the second connection portion has an upper end opposing the lower end of the second connection portion in the thickness direction of the capacitor body, and
the plurality of conductive bonding portions of the conductive bonding layer disposed between the first metal frame and the first external electrode are spaced apart from each other in a width direction of the capacitor body different from the thickness direction and the length direction of the capacitor body.

20. The electronic component of claim 13, wherein a first metal frame of the pair of the metal frames comprises a first connection portion connected to a first external electrode of the pair of external electrodes, and a first mounting portion bent to extend, in a length direction of the capacitor body, from a lower end of the first connection portion,
a second metal frame of the pair of the metal frames comprises a second connection portion connected to a second external electrode of the pair of external electrodes, and a second mounting portion bent to extend from a lower end of the second connection portion towards the first mounting portion,
the first connection portion has an upper end opposing the lower end of the first connection portion in a thickness direction of the capacitor body,
the second connection portion has an upper end opposing the lower end of the second connection portion in the thickness direction of the capacitor body, and
the plurality of conductive bonding portions of the conductive bonding layer disposed between the first metal frame and the first external electrode are spaced apart from each other in the thickness direction of the capacitor body.

* * * * *